(12) United States Patent
Zhou et al.

(10) Patent No.: US 7,091,755 B1
(45) Date of Patent: Aug. 15, 2006

(54) LOW VOLTAGE INPUT CIRCUIT WITH HIGH VOLTAGE TOLERANCE CAPABILITY

(75) Inventors: Shi-dong Zhou, Milpitas, CA (US); Gubo Huang, Milpitas, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/943,670

(22) Filed: Sep. 17, 2004

(51) Int. Cl.
*H03K 3/00* (2006.01)

(52) U.S. Cl. .......................... 327/108; 326/58

(58) Field of Classification Search ........ 327/108–112; 326/56, 58
See application file for complete search history.

(56) References Cited

U.S. PATENT DOCUMENTS

| | | | |
|---|---|---|---|
| 4,019,178 A * | 4/1977 | Hashimoto et al. ......... 345/53 |
| 6,107,829 A * | 8/2000 | Martin ..................... 326/58 |
| 6,249,169 B1 * | 6/2001 | Okada ..................... 327/333 |
| 6,559,675 B1 * | 5/2003 | Koo ........................ 326/81 |
| 6,693,469 B1 * | 2/2004 | Prodanov ................ 327/108 |
| 6,867,445 B1 * | 3/2005 | Jang ....................... 257/265 |

* cited by examiner

*Primary Examiner*—Kenneth B. Wells
(74) *Attorney, Agent, or Firm*—William L. Paradice, III

(57) ABSTRACT

An input circuit includes a first buffer having a first power terminal coupled to a first supply voltage, a second power terminal coupled to ground potential, an input to receive an input signal, and an output to generate a first output signal, a second buffer having a first terminal coupled to a second supply voltage, a second terminal coupled to a bias node, an input to receive the input signal, and an output to generate a second output signal, and a control circuit configured to selectively connect the bias node either to the second supply voltage or to ground potential in response to an enable signal.

27 Claims, 3 Drawing Sheets

LOW VOLTAGE INPUT CIRCUIT WITH HIGH VOLTAGE TOLERANCE CAPABILITY

FIELD OF INVENTION

The present invention relates generally to integrated circuits, and more specifically to enabling communication between integrated circuit devices having different power supplies.

DESCRIPTION OF RELATED ART

As integrated circuit (IC) designs become more complex and include greater numbers of transistors, IC developers are moving to smaller process geometries to conserve valuable silicon area. Because smaller transistors are more susceptible to breakdown, smaller process geometries typically use smaller supply voltages. Thus, IC transistor sizes and operating voltages have steadily declined over the years. For example, while early sub-micron IC devices used a power supply of 5 volts, 0.35 micron processes typically use a power supply of 3.3 volts, and 0.25 micron processes typically use a power supply of 2.5 volts. Thus, because different IC devices can have different power supplies, it is desirable for IC devices to have input/output (I/O) circuitry that can receive and transmit logic signals having different voltage swings without damaging internal logic.

However, configuring an I/O circuit to communicate with IC devices that utilize different supply voltages typically requires balancing performance with reliability. For example, although a transistor's performance may be increased by minimizing the thickness of its gate oxide, reducing the thickness of the gate oxide increases its susceptibility to voltage breakdown. As a result, IC manufacturers typically select a gate oxide thickness that achieves an optimal balance between performance and gate oxide lifetime for a particular supply voltage. Thus, for example, IC devices designed for 3.3 volt operation are typically not suitable for communicating with 5 volt devices.

FIG. 1 shows a prior art I/O circuit 100 that buffers logic signals for an IC device 10 having a logic core 130. For purposes of discussion herein, device 10 utilizes a supply voltage VDD of 3.3 volts, and is thus referred to herein as a 3.3 volt device. Circuit 100 includes a well-known input buffer 110 and a well-known output buffer 120. Input buffer 110 is configured as a CMOS inverter 111 having a PMOS transistor 111p and an NMOS transistor 111n connected in series between VDD and ground potential. The commonly-coupled gates of transistors 111p and 111n form an inverter input to receive an input signal from a bus 1 via an I/O pad 101, and the commonly-coupled drains of transistors 111p and 111n form an inverter output that is coupled to logic core 130 via signal line 102. Output buffer 120, which includes power terminals (not shown for simplicity) coupled to VDD and ground potential, buffers output signals received from logic core 130 via signal line 103 to I/O pad 101. The operation of circuit 100 is well-known, and therefore is not described in detail herein.

To maximize performance, transistors 111p and 111n are typically low-voltage transistors having relatively thin layers of gate oxide and relatively low threshold voltages to optimize input circuit 110 for 3.3 volt operation. Thus, for example, low-voltage transistors 111p and 111n are configured to tolerate voltage differentials of approximately 3.3 volts. As a result, connecting another device (not shown for simplicity) that utilizes a supply voltage of 5 volts to bus 1 to communicate with device 10 via I/O pad 101 may seriously damage device 10's input circuit 110. For example, providing an input signal having a logic high state of approximately 5 volts to I/O pad 101 would create voltage differentials of approximately 5 volts across transistors 111p and 111n and therefore likely damage the gate oxides of transistors 111p and 111n.

One solution to allow device 10 to receive signals from a 5 volt device is to replace low-voltage transistors 111p and 111n with high-voltage transistors having relatively thick layers of gate oxide and relatively high threshold voltages so that the application of a logic high 5 volt signal to I/O pad 101 does not damage the gate oxides of the input circuit's transistors. However, replacing low-voltage transistors 111p and 111n with high-voltage transistors undesirably degrades performance of input circuit 110. For example, increasing the gate oxide thickness of transistors 111p and 111n not only reduces switching speed but also increases their threshold voltages (VT), which in turn limits the ability of I/O circuit 100 to process very low-voltage signals (e.g., input signals from a 2.5 volt device).

Another solution to allow device 10 to receive signals from a 5 volt device is to clamp the voltage at the gates of transistors 111p and 111n at approximately 3.3 volts. For example, FIG. 2 shows device 10 as having an input circuit 210 that includes inverter 111, a low-voltage NMOS pass transistor 211, and a low-voltage PMOS pull-up transistor 212. Transistor 211 is coupled between I/O pad 101 and the input of inverter 111, and has a gate coupled to VDD. Transistor 212 is coupled between VDD and the input of inverter 111, and includes a gate coupled to the output of inverter 111.

When a logic high 5 volt signal is provided to input circuit 210 via I/O pad 101, for example, from a 5 volt device (not shown for simplicity) connected to bus 1, the drain of transistor 211 is driven high to approximately 5 volts. Because the gate voltage of transistor 211 is approximately 3.3 volts, the gate-to-drain voltage (Vgd) of transistor 211 is approximately 1.7 volts. The source voltage of transistor 211 is approximately one VT below VDD, thereby turning off transistor 111p and turning on transistor 111n to pull signal line 102 to ground potential. The resulting logic low state of signal line 102 turns on PMOS transistor 212, which pulls the input of inverter 111 to VDD. Thus, because transistor 211 has a maximum Vgd of approximately 1.7 volts and a maximum gate-to-source voltage (Vgs) of approximately VT, transistor 211's gate oxide is not damaged. Further, because transistor 211 limits the input voltage of inverter 111 to approximately VDD, the gate oxides of transistors 111p and 111n are not damaged. In this manner, input circuit 210 allows device 10 to operate with 5 volt devices.

Unfortunately, input circuit 210 may undesirably prevent bus 1 from being fully tri-stated. For example, if the voltage on bus 1 floats above approximately VDD/2 while bus 1 is tri-stated, transistor 211 drives the input of inverter 111 to approximately VDD/2. The resultant logic high state at the inverter input turns off transistor 111p and turns on transistor 111n, thereby pulling signal line 102 to ground potential. The resultant logic low state of signal line 102 turns on PMOS transistor 212, which drives bus 1 high toward VDD via transistor 211. As a result, bus 1 is no longer tri-stated. Accordingly, because input circuit 210 may inadvertently drive bus 1 to a logic high state while bus 1 is tri-stated, input circuit 210 is not suitable for applications in which bus 1 may need to remain tri-stated.

Therefore, there is a need for an input circuit that can receive input signals from devices using different supply voltages without incurring damage and without inadvertently driving a tri-stated input to a particular logic state.

SUMMARY

In accordance with the present invention, an IC device includes an input circuit having a high-voltage circuit, a low-voltage circuit, and a select circuit. The high-voltage circuit is optimized for relatively high voltage operation, and the low-voltage circuit is optimized for relatively low voltage operation. The select circuit selectively connects either the high-voltage circuit or the low-voltage circuit to the device's internal logic depending upon to the voltage level of an input signal. For relatively high voltage input signals, the high-voltage circuit is selected to avoid damage to the input circuit, and for relatively low voltage input signals, the low-voltage circuit is selected to maximize performance.

For some embodiments, the high-voltage circuit includes a first buffer, and the low-voltage circuit includes a second buffer and a control circuit. The first buffer is optimized for relatively high voltage operation, and includes a first power terminal coupled to a first supply voltage, a second power terminal coupled to ground potential, an input to receive the input signal, and an output coupled to the select circuit. The second buffer is optimized for relatively low voltage operation, and includes a first power terminal coupled to a second supply voltage, a second power terminal coupled to a bias node, an input to receive the input signal, and an output coupled to the select circuit. The control circuit includes a first power terminal coupled to the second supply voltage, a second power terminal coupled to ground potential, an output coupled to the bias node, and an input to receive an enable signal. The first supply voltage is a relatively high supply voltage, and the second supply voltage is a relatively low supply voltage. For example, for one embodiment, the first supply voltage is approximately 5 volts and the second supply voltage is approximately 3.3 volts.

To configure the input circuit for relatively high voltage operation, the select circuit selects the high-voltage circuit to process the input signal. Also, the enable signal is de-asserted and, in response thereto, the control circuit couples the bias node to the second supply voltage, which disables the second buffer. Further, because both power terminals of the second buffer are coupled to the second supply voltage, the relatively high voltage swing of the input signal does not damage the second buffer. To configure the input circuit for relatively low voltage operation, the enable signal is asserted and, in response thereto, the control circuit couples the second power terminal of the second buffer to ground potential, thereby enabling the second buffer to process the input signal. Because the second buffer is optimized for relatively low voltage operation, performance is maximized by selecting the second buffer instead of the first buffer to process the relatively low voltage input signal.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

The present invention is described below in the context of 3.3 volt devices and 5 volt devices for exemplary purposes only. Thus, it is to be understood that embodiments of the present invention may used to facilitate communication between devices that utilize other operating voltages and/or that generate signals using other voltages to indicate various logic states. Similarly, although the low-voltage and high-voltage transistors used for exemplary embodiments described herein are optimized for 3.3 volt operation and 5 volt operation, respectively, for other embodiments the low-voltage transistors and the high-voltage transistors may be optimized for other supply voltages. In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary and, thus, can be modified (e.g., reversed polarity) as desired. Accordingly, the present invention is not to be construed as limited to specific examples described herein but rather includes within its scope all embodiments defined by the appended claims.

Figure 1:
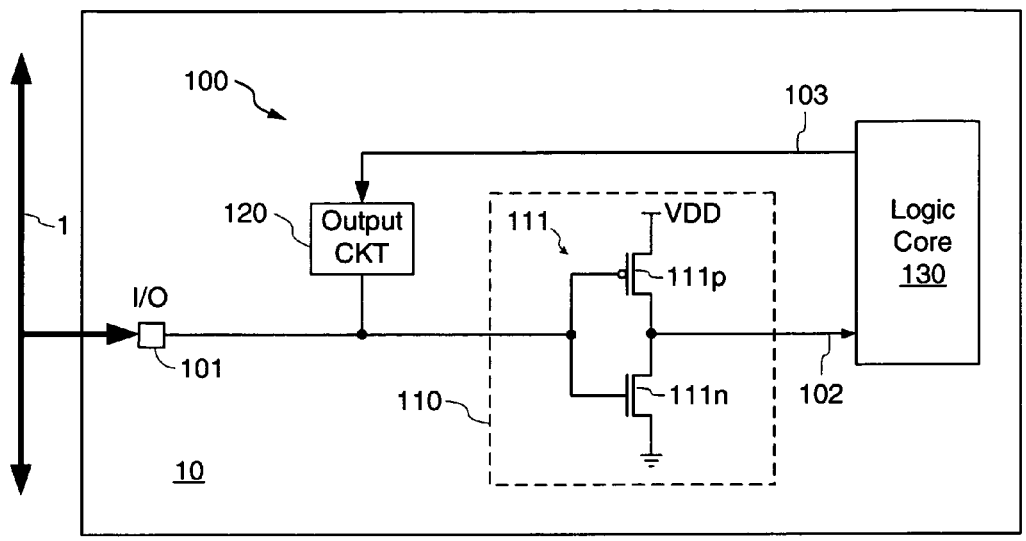
FIG. 1 is a block diagram of a prior I/O circuit.
Figure 2:
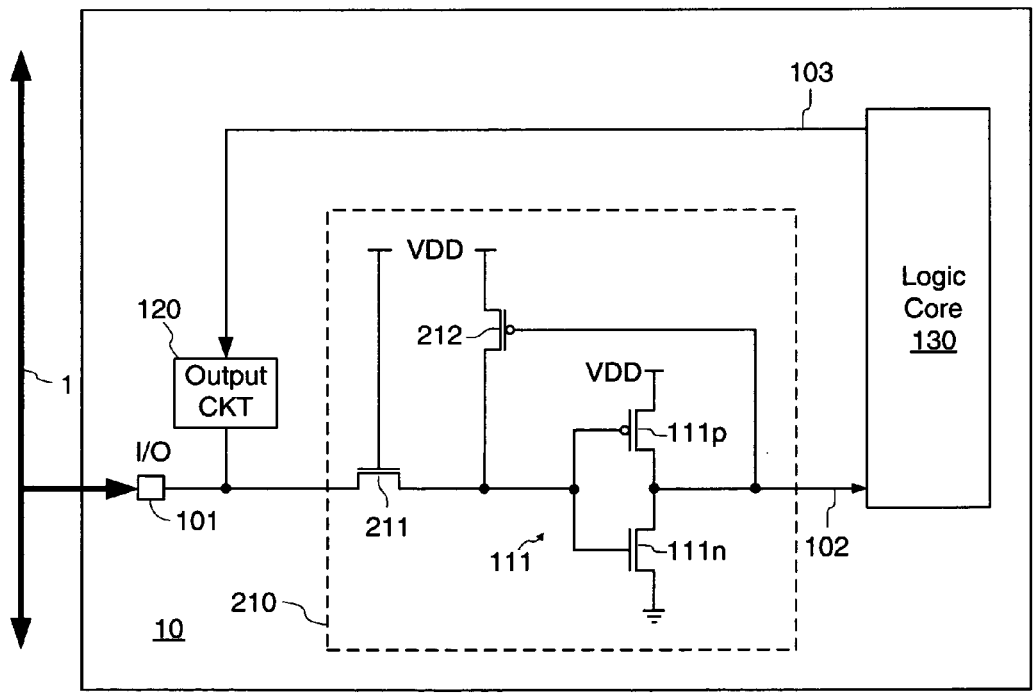
FIG. 2 is a block diagram of another prior I/O circuit.
Figure 3:
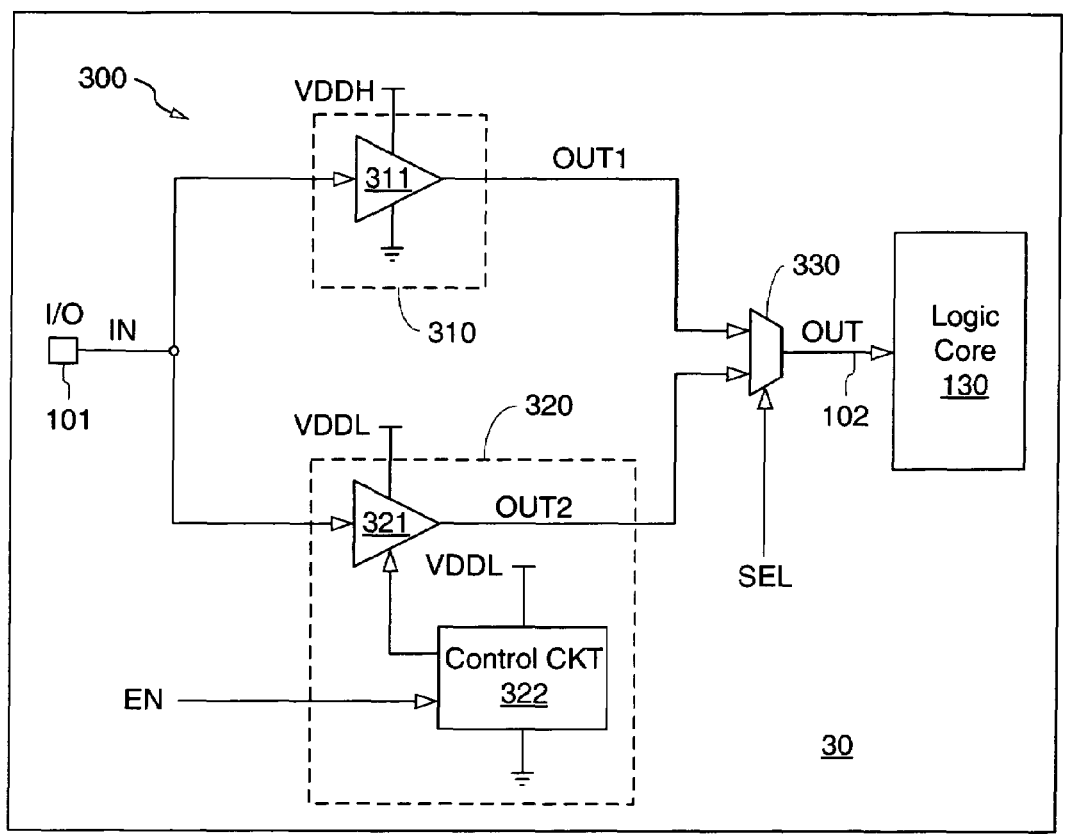
FIG. 3 is a block diagram of an input circuit in accordance with some embodiments of the present invention.

FIG. 3 shows an exemplary IC device 30 having an input circuit 300 configured in accordance with some embodiments of the present invention. Device 30, which may be any well-known IC device such as a programmable logic device, is shown to include a relatively high supply voltage VDDH and a relatively low supply voltage VDDL. For the exemplary embodiments described herein, VDDH=5 volts and VDDL=3.3 volts, although for other embodiments VDDH and VDDL may be other suitable voltages. Voltage sources VDDH and VDDL may be generated on chip as regulated voltage supplies (e.g., using well-known charge pumps), or may be supplied by external sources. Input circuit 300 includes an input IN coupled to I/O pad 101 and an output OUT coupled to logic core 130, which may be any suitable circuit, logic, processor, memory, programmable fabric and the like. For simplicity, other well-known components of device 30 are not shown in FIG. 3. For example, although not shown in FIG. 3, actual embodiments of device 30 may include an output circuit such as output circuit 120 of FIGS. 1 and 2 coupled between logic core 130 and I/O pad 101.

Input circuit 300 includes a high-voltage circuit 310, a low-voltage circuit 320, and a select circuit 330. Although select circuit 330 is shown in FIG. 3 as a multiplexer (MUX) 330, other select circuits may be used. High-voltage circuit 310 includes a buffer 311 having a first power terminal coupled to VDDH, a second power terminal coupled to ground potential, an input coupled to I/O pad 101, and an output OUT1 coupled to a first input of MUX 330. Buffer 311, which may be any well-known buffer circuit, is optimized to process 5 volt input signals (e.g., logic signals having a voltage swing approximately between 0 volts and 5 volts) received from I/O pad 101.

Low-voltage circuit 320 includes a buffer 321 and a control circuit 322. Buffer 321 has a first power terminal coupled to VDDL, a second power terminal, an input coupled to I/O pad 101, and an output OUT2 coupled to a second input of MUX 330. Buffer 321, which may be any well-known buffer circuit, is optimized to process 3.3 volt input signals (e.g., logic signals having a voltage swing approximately between 0 volts and 3.3 volts) received from I/O pad 101. Control circuit 322 includes a first power terminal coupled to VDDL, a second power terminal coupled to ground potential, an output coupled to the second power terminal of buffer 321, and an input to receive an enable signal EN.

MUX 330 includes an output coupled to logic core 130 via signal line 102 and a control terminal to receive a select signal SEL. MUX 330 selectively couples signal line 102 either to the output of buffer 311 or to the output of buffer 321 in response to SEL.

For some embodiments, SEL and EN may be generated on-chip, e.g., by suitable circuitry (not shown for simplicity) within device 30. For other embodiments, SEL and EN may be provided as input signals to device 30, for example, via corresponding input pads (not shown for simplicity). As will be described below, in some embodiments, SEL and EN may be the same signal, or SEL may be derived from EN or vice versa. In other embodiments, they may be generated independently.

The operation of input circuit 300 is as follows. To configure input circuit 300 for 5 volt operation (e.g., when I/O pad 101 is connected to a 5 volt device), SEL is driven to a logic low state and EN is de-asserted (e.g., to a logic low state). In response to the logic low state of SEL, MUX 330 couples signal line 102 to the output of buffer 311, which in turn buffers the 5 volt input signal from I/O pad 101 to logic core 130 via signal line 102 in a well-known manner. Because buffer 311 is optimized for 5 volt operation, for example, by using high-voltage transistors, driving I/O pad 101 to 5 volts does not damage buffer 311. The de-asserted state of EN causes control circuit 322 to couple the second power terminal of buffer 321 to VDDL, which disables buffer 321 and, as explained in more detail below, prevents a 5 volt signal applied to I/O pad 101 from damaging buffer 321.

To configure input circuit 300 for 3.3 volt operation (e.g., when I/O pad 101 is connected to a 3.3 volt device), SEL is driven to a logic high state and EN is asserted (e.g., to a logic high state). The logic high state of SEL causes MUX 330 to couple signal line 102 to the output of buffer 321. The asserted state of EN causes control circuit 322 to couple the second power terminal of buffer 321 to ground potential, which enables buffer 321 to buffer the input signal from I/O pad 101 to logic core 130 via signal line 102. Because buffer 321 is optimized for 3.3 volt operation, for example, by using low-voltage transistors, using buffer 321 to process 3.3 volt signals instead of using buffer 311 maximizes performance of input circuit 300 for 3.3 volt operation.

Thus, in accordance with the present invention, input circuit 300 allows device 30 to be compatible with both 5 volt devices and 3.3 volt devices without incurring damage when processing 5 volt signals and without sacrificing performance when processing 3.3 volt signals. Further, unlike some prior input circuits such as input circuit 210 of FIG. 2, input circuit 300 does not inadvertently alter the voltage on I/O pad 101 while I/O pad 101 is tri-stated.

Figure 4:
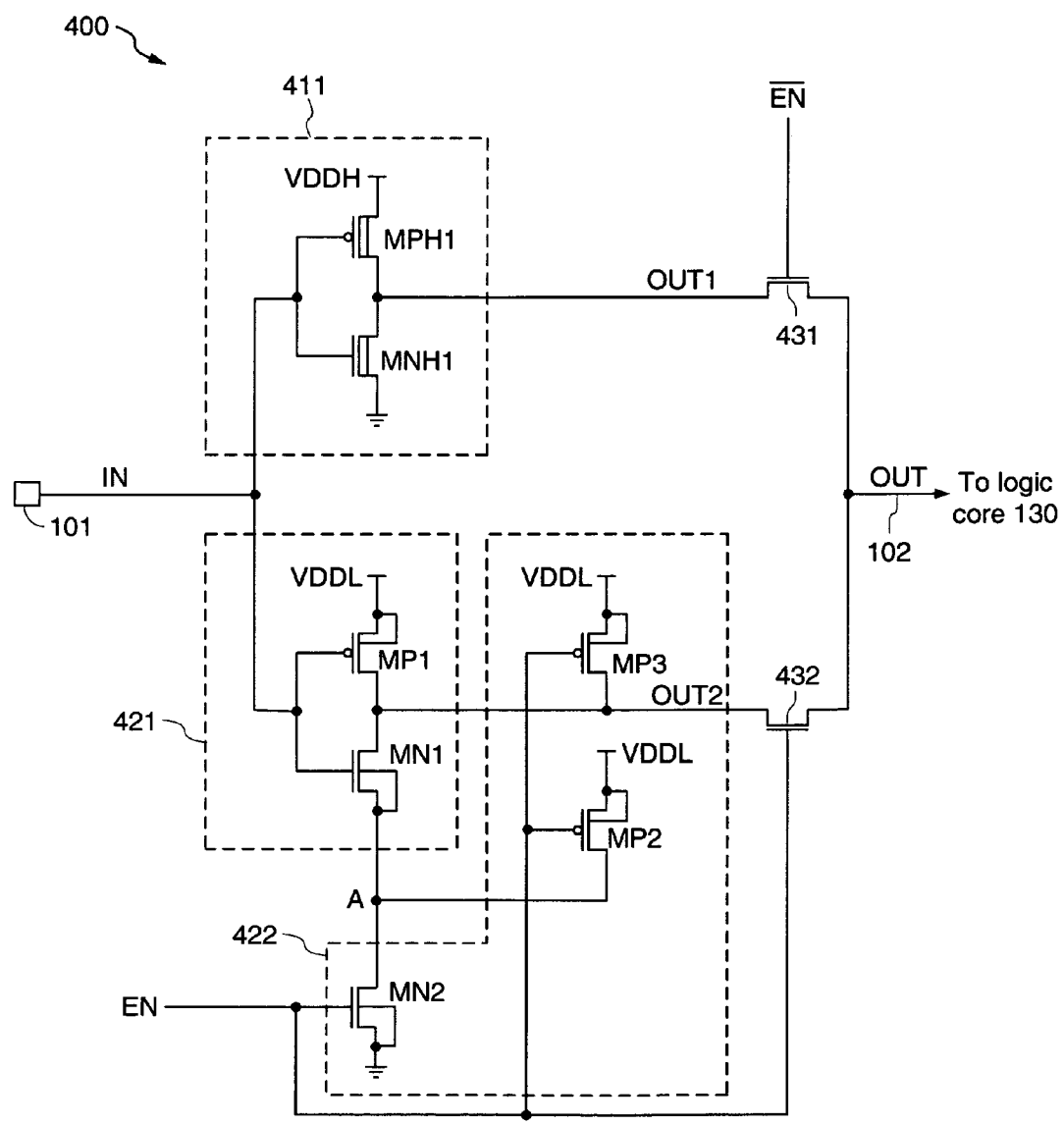
FIG. 4 is a circuit diagram of one embodiment of the input circuit of FIG. 3.

FIG. 4 shows an input circuit 400 that is one embodiment of input circuit 300 of FIG. 3. Input circuit 400 includes a high-voltage buffer 411, a low-voltage buffer 421, a control circuit 422, and NMOS pass transistors 431 and 432. High-voltage buffer 411, which is one embodiment of buffer 311 of FIG. 3, is shown in the exemplary embodiment of FIG. 4 as a CMOS inverter formed by a PMOS transistor MPH1 and an NMOS transistor MNH1 connected in series between VDDH and ground potential. The common gates of transistors MPH1 and MNH1 form an input of buffer 411 that is coupled to I/O pad 101, and the common drains of transistors MPH1 and MNH1 form an output OUT1 of buffer 411. Transistors MPH1 and MNH1 are high-voltage transistors having relatively thick layers of gate oxide and relatively high threshold voltages, thereby allowing buffer 411 to tolerate relatively large voltage differentials. Thus, for the exemplary embodiment of FIG. 4, high-voltage transistors MPH1 and MNH1 are optimized for 5 volt operation, for example, and thus can tolerate voltage differentials of at least 5 volts.

Low-voltage buffer 421, which is one embodiment of buffer 321 of FIG. 3, is shown in the exemplary embodiment of FIG. 4 as a CMOS inverter formed by PMOS transistor MP1 and NMOS transistor MN1 connected in series between VDDL and a bias node A. The common gates of transistors MP1 and MN1 form an input of buffer 421 that is coupled to I/O pad 101, and the common drains of transistors MP1 and MN1 form an output OUT2 of buffer 421. For some embodiments, transistors MP1 and MN1 are low-voltage transistors having relatively thin layers of gate oxide and relatively low threshold voltages, thereby maximizing performance for relatively low voltage input signals. Thus, for the exemplary embodiment of FIG. 4, low-voltage transistors MP1 and MN1 are optimized for 3.3 volt operation.

For other embodiments, buffers 411 and 421 may be of other suitable architectures.

Control circuit 422, which is one embodiment of control circuit 322 of FIG. 3, includes PMOS pull-up transistors MP2–MP3 and NMOS pull-down transistor MN2. For some embodiments, transistors MP2–MP3 and MN2 are low-voltage transistors having relatively thin layers of gate oxide and relatively low threshold voltages, although for other embodiments other transistors may be used. PMOS transistor MP3 is coupled between VDDL and the output of buffer 421, and has a gate to receive EN. PMOS transistor MP2 is coupled between VDDL and bias node A, and has a gate to receive EN. NMOS transistor MN2 is coupled between bias node A and ground potential, and has a gate to receive EN.

For one embodiment in which input circuit 400 is fabricated using a 0.35 micron process technology and VDDH=5 volts and VDDL=3.3 volts, transistors MPH1 and MPH2 have a gate oxide thickness of approximately 150 Angstroms and a threshold voltage VT of approximately 0.9 volts, transistors MP1 and MN1 have a gate oxide thickness of approximately 70 Angstroms and a VT of approximately 0.7 volts, and transistors MP2, MP3, and MN2 have a gate oxide thickness of approximately 70 Angstroms and a VT of approximately 0.7 volts.

NMOS pass transistor 431 is coupled between the output of buffer 411 and signal line 102, and has a gate to receive $\overline{EN}$, which is the logical complement of EN. NMOS pass transistor 432 is coupled between the output of buffer 421 and signal line 102, and has a gate to receive EN. Together, NMOS transistors 431–432 form a select circuit that is one embodiment of MUX 330 of FIG. 3. For some embodiments, pass transistors 431–432 are low-voltage transistors having relatively thin layers of gate oxide and relatively low threshold voltages, although for other embodiments other pass transistors may be used.

An exemplary operation of input circuit 400 is as follows. To configure input circuit 400 for 5 volt operation, EN is de-asserted to a logic low state (and thus $\overline{EN}$ is asserted to a logic high state). The logic high state of $\overline{EN}$ turns on pass transistor 431 to couple the output of buffer 411 to signal line 102. If the input signal IN is in a logic low state (e.g., IN=0 volts), transistor MPH1 turns on and transistor MNH1 turns off, thereby pulling the output of buffer 411 to VDDH. Pass transistor 431 passes the resultant logic high state of OUT1 to logic core 130 via signal line 102. Conversely, if IN is in a logic high state (e.g., IN=5 volts), transistor MPH1 turns off and transistor MNH1 turns on, thereby pulling the output of buffer 411 to ground potential. Pass transistor 431 passes the resultant logic low state of OUT1 to logic core 130 via signal line 102. As mentioned above, because transistors MPH1 and MPH2 are high-voltage transistors that can tolerate voltage differentials of at least 5 volts, the application of a 5 volt signal to I/O pad 101 does not damage buffer 411.

The logic low state of EN turns off pass transistor 432 to isolate the output of buffer 421 from signal line 102, and turns off transistor MN2 to isolate the bias node A from ground potential. The logic low state of EN also turns on transistors MP2 and MP3. The conductive state of transistor MP3 pulls the output of buffer 421 to VDDL. The conductive state of transistor MP2 pulls the bias node A to VDDL, thereby connecting the second power terminal of buffer 421 to VDDL. Because both power terminals (and the output) of buffer 421 are coupled to VDDL when EN is de-asserted, the application of a 5 volt signal to I/O pad 101 creates a voltage differential of approximately VDDH−VDDL=5−3.3=1.7 volts for transistors MP1 and MN1, which is insufficient to damage transistors MP1 and MN1. In this manner, input circuit 400 can process 5 volt input signals without damaging buffer 421.

To configure input circuit 400 for 3.3 volt operation, EN is asserted to a logic high state (and thus $\overline{EN}$ is de-asserted to a logic low state). The logic low state of $\overline{EN}$ turns off pass transistor 431 to isolate the output of buffer 411 from signal line 102. The logic high state of EN turns on pass transistor 432 to couple the output of buffer 421 to signal line 102, and turns on transistor MN2 to couple the bias node A to ground potential, thereby connecting the second power terminal of buffer 421 to ground potential. The logic high state of EN also turns off transistors MP2 and MP3. The non-conductive state of transistor MP3 isolates the output of buffer 421 from VDDL, and the non-conductive state of transistor MP2 isolates the bias node A from VDDL.

If the input signal IN is in a logic low state (e.g., IN=0 volts), transistor MP1 turns on and transistor MN1 turns off, thereby pulling the output of buffer 421 to VDDL. Pass transistor 432 passes the resultant logic high state of OUT2 to logic core 130 via signal line 102. Conversely, if IN is in a logic high state (e.g., IN=3.3 volts), transistor MP1 turns off and transistor MN1 turns on, thereby pulling the output of buffer 421 to ground potential. Pass transistor 432 passes the resultant logic low state of OUT2 to logic core 130 via signal line 102. As mentioned above, transistors MP1 and MP2 are low-voltage transistors configured for 3.3 volt operation, thereby maximizing performance in processing 3.3 volt input signals. In addition, the relatively low threshold voltages of transistors MP1 and MN1 allow input circuit 400 to process input signals having very low voltage swings, e.g., such as those generated by a 2.5 or 1.8 volt device.

Figure 5:
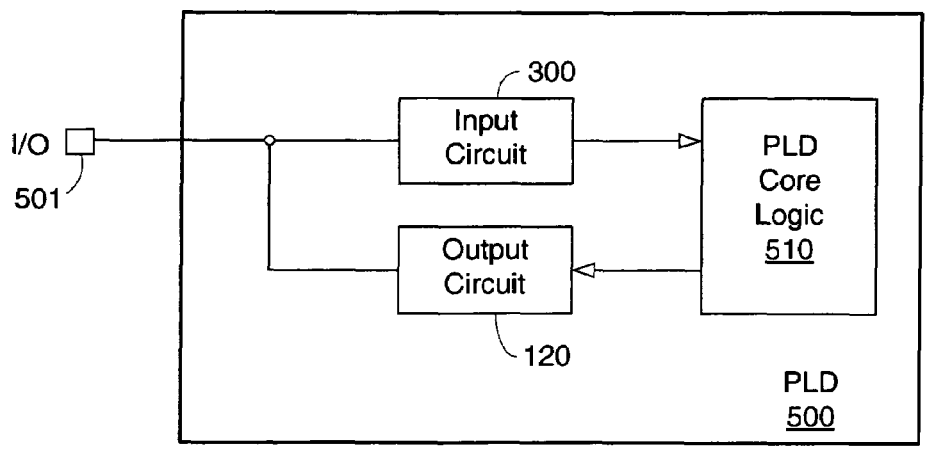
FIG. 5 is a block diagram illustrating the input circuit of FIG. 3 implemented in a programmable logic device.

FIG. 5 shows input circuit 300 implemented as part of a PLD 500. Input circuit 300, which is coupled between the PLD's I/O pad 501 and its core logic 510, allows PLD 500 to communicate with 5 volt devices without damaging input circuit 300 and allows PLD 500 to communicate with 3.3 volt devices without sacrificing performance, as described above with respect to FIGS. 3 and 4. PLD 500 is also shown to include output circuit 120 coupled between I/O pad 501 and core logic 510. PLD 500 may be any suitable device such as a field programmable gate array (FPGA) or a complex programmable logic device (CPLD), and core logic 510 may include any well-known PLD components such as configurable logic blocks (CLBs), I/O blocks, memory, microprocessors, programmable routing structures, and the like. For other embodiments, input circuit 300 may be implemented in other well-known IC devices (e.g., devices other than a PLD).

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. An input circuit for receiving an input signal, comprising:
   a first buffer having a first power terminal coupled to a first supply voltage, a second power terminal coupled to ground potential, an input to receive the input signal, and an output to generate a first output signal;
   a second buffer having a first power terminal coupled to a second supply voltage, a second power terminal coupled to a bias node, an input to receive the input signal, and an output to generate a second output signal;
   a control circuit configured to selectively connect the bias node either to the second supply voltage or to ground potential in response to an enable signal; and
   a select circuit configured to selectively output either the first output signal or the second output signal in response to a select signal.

2. The input circuit of claim 1, wherein the enable signal comprises the select signal.

3. The input circuit of claim 1, wherein the first buffer is optimized for relatively high voltage operation and the second buffer is optimized for relatively low voltage operation.

4. The input circuit of claim 1, wherein:
   the first buffer comprises a high-voltage PMOS transistor and a high-voltage NMOS transistor connected in series between the first supply voltage and ground potential; and
   the second buffer comprises a low-voltage PMOS transistor and a low-voltage NMOS transistor connected in series between the second supply voltage and the bias node.

5. The input circuit of claim 1, wherein the first supply voltage is greater than the second supply voltage.

6. The input circuit of claim 1, wherein the enable signal selectively disables the second buffer.

7. The input circuit of claim 1, wherein the control circuit couples the second power terminal of the second buffer to the second supply voltage in response to a first state of the enable signal such that the second buffer is disabled.

8. The input circuit of claim 7, wherein the control circuit couples the second power terminal of the second buffer to ground potential in response to a second state of the enable signal, different from the first state, such that the second buffer is enabled.

9. The input circuit of claim 1, wherein the control circuit comprises:
   a first power terminal coupled to the second supply voltage, a second power terminal coupled to ground potential, an output coupled to the bias node, and an input to receive the enable signal.

10. The input circuit of claim 1, wherein the control circuit comprises:
a first pull-down transistor coupled between the bias node and ground potential and having gate to receive the enable signal; and
a first pull-up transistor coupled between the second supply voltage and the bias node and having a gate to receive the enable signal.

11. The input circuit of claim 10, wherein the control circuit further comprises:
a second pull-up transistor coupled between the second supply voltage and the output of the second buffer and having a gate to receive the enable signal.

12. The input circuit of claim 1, wherein the input circuit is part of a programmable logic device.

13. An input circuit for high-voltage and low-voltage operations, comprising:
a buffer having a first power terminal coupled to a supply voltage, a second power terminal coupled to a bias node, an input to receive varying input signal, and an output to generate an output signal; and
a control circuit having an input to receive an enable signal, an output coupled to the bias node, a first power terminal coupled to the supply voltage, and a second power terminal coupled to ground potential;
wherein when the enable signal is asserted, the control circuit connects the bias node to the around potential, and
wherein when the enable signal is de-asserted, the control circuit connects the bias node to the supply voltage.

14. The input circuit of claim 13, wherein the control circuit disables the buffer by connecting the second power terminal of the buffer to the supply voltage.

15. The input circuit of claim 13, wherein the control circuit enables the buffer by connecting the second power terminal of the buffer to ground potential.

16. The input circuit of claim 13, wherein the buffer comprises an inverter.

17. The input circuit of claim 13, wherein the control circuit comprises:
a first pull-down transistor coupled between the bias node and ground potential and having gate to receive the enable signal; and
a first pull-up transistor coupled between the supply voltage and the bias node and having a gate to receive the enable signal.

18. The input circuit of claim 17, wherein the control circuit further comprises:
a second pull-up transistor coupled between the supply voltage and the output and having a gate to receive the enable signal.

19. The input circuit of claim 13, wherein the input circuit is a part of a programmable logic device.

20. An input circuit, comprising:
a buffer having a first power terminal coupled to a supply voltage, a second power terminal, an input to receive an input signal, and an output to generate an output signal; and
means for selectively connecting the second power terminal of the buffer to the supply voltage when the input circuit is configured for high-voltage operation and to ground potential when the input circuit is configured for low-voltage operation.

21. The input circuit of claim 20, wherein the means for selectively connecting couples the second power terminal of the buffer to the supply voltage such that the buffer is disabled when an enable signal is in a first state; and
wherein the means for selectively connecting couples the second power terminal of the buffer to ground potential such that the buffer is enabled when the enable signal is in a second state different from the first state.

22. The buffer circuit of claim 20, wherein the buffer comprises a PMOS transistor and an NMOS transistor connected in series between the supply voltage and the means for selectively connecting.

23. A method for operating an input circuit selectively configurable for high-voltage operation and low-voltage operations, comprising:
providing a buffer having a first power terminal coupled to a supply voltage, a second power terminal, an input to receive an input signal, and an output; and
selectively connecting the second power terminal of the buffer to the supply voltage when the input circuit is configured for high-voltage operation and to ground potential when the input circuit is configured for low-voltage operation.

24. The method of claim 23, further comprising:
generating an enable signal, the enable signal for selecting on of the high-voltage and the low-voltage operation.

25. The method of claim 24, further comprising:
de-asserting the enable signal to disable the buffer; and
asserting the enable signal to enable the buffer.

26. The method of claim 25, wherein de-asserting the enable signal connects the second power terminal of the buffer to the supply voltage.

27. The method of claim 25, wherein asserting the enable signal connects the second power terminal of the buffer to ground potential.

* * * * *